United States Patent
Wheeler et al.

(10) Patent No.: US 6,603,291 B2
(45) Date of Patent: Aug. 5, 2003

(54) INTEGRATED FET AND DRIVER FOR USE IN A SYNCHRONOUS DC-DC CONVERSION CIRCUIT

(75) Inventors: Nicolas J. Wheeler, Manchester (GB); Leonardus A. De Groot, Budel (NL); Philip Rutter, Stockport (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/066,991

(22) Filed: Feb. 4, 2002

(65) Prior Publication Data

US 2002/0175661 A1 Nov. 28, 2002

(30) Foreign Application Priority Data

Feb. 6, 2001 (GB) .............................................. 0102912
May 24, 2001 (GB) .............................................. 0112584

(51) Int. Cl.[7] .............................................. G05F 1/613
(52) U.S. Cl. ...................................... 323/224; 323/284
(58) Field of Search ................................. 323/224, 282, 323/283, 284

(56) References Cited

U.S. PATENT DOCUMENTS

| | | | | |
|---|---|---|---|---|
| 4,801,859 A | * | 1/1989 | Dishner | 323/224 |
| 5,479,089 A | | 12/1995 | Lee | 323/283 |
| 6,175,225 B1 | | 1/2001 | De Groot | 323/282 |
| 6,184,585 B1 | | 2/2001 | Martinez et al. | 257/777 |
| 6,472,855 B2 | * | 10/2002 | Ball | 323/282 |

FOREIGN PATENT DOCUMENTS

WO          WO9849607          4/1998

* cited by examiner

Primary Examiner—Shawn Riley
(74) Attorney, Agent, or Firm—Steven R. Biren (57) ABSTRACT

An integrated driver circuit includes a low side component and a synchronous dc voltage converter circuit. A sync FET (8) is controlled by a driver (32) powered between high and low voltage power connections (134, 138). A timing circuit (150) controls the driver circuit in accordance with a signal on a control input. The driver circuit (32) is isolated from the timing circuit (150), for example by a level shift circuit (136) and the low voltage power connection (138) of the driver circuit is directly connected to the source (108) of the sync FET (8). This arrangement is intended to reduce transient voltage effects.

10 Claims, 6 Drawing Sheets

INTEGRATED FET AND DRIVER FOR USE IN A SYNCHRONOUS DC-DC CONVERSION CIRCUIT

BACKGROUND OF THE INVENTION

The invention relates to an integrated FET and driver, particularly but not exclusively for use in a synchronous dc—dc conversion circuit.

Direct current (dc) to dc converters are known in the art, and are generally used to convert from one dc voltage level to another, for example to provide a 1.5V voltage rail from a 12V voltage supply.

Figure 1:
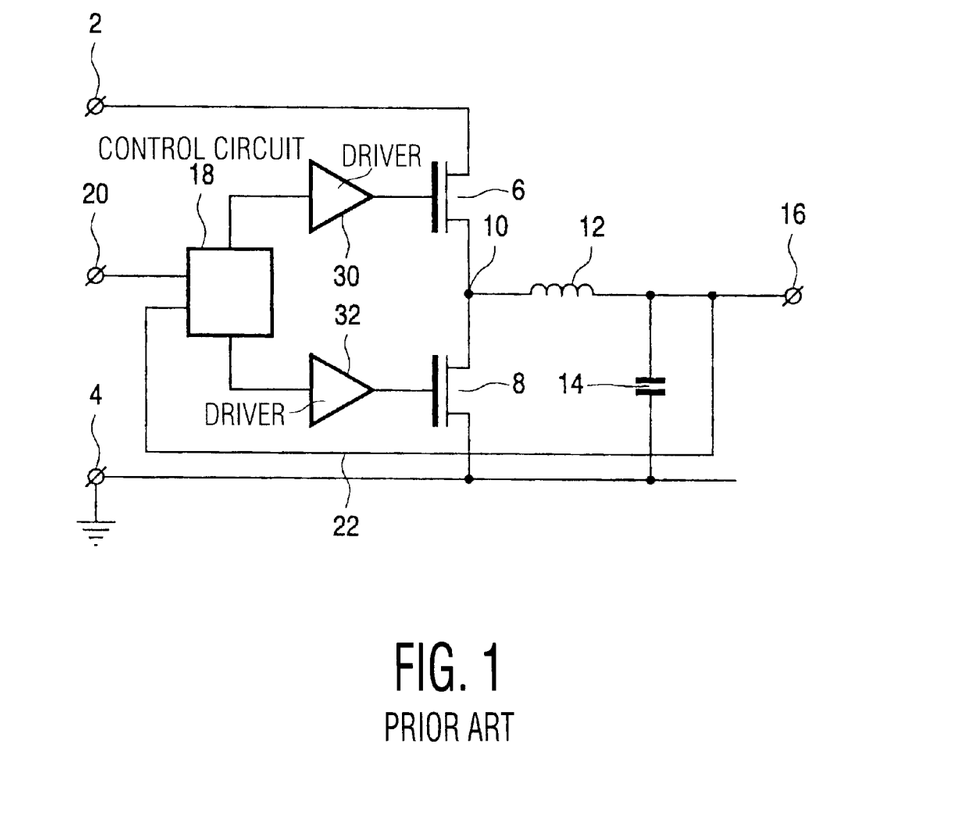
FIG. 1 shows a schematic diagram of a conventional synchronous dc—dc converter.

One type of converter, a synchronous dc—dc converter, is illustrated schematically in FIG. 1. An input voltage $V_{in}$ is applied between input terminals 2, 4. A pair of transistors, here field effect transistors 6,8, are connected between the input terminals 2, 4. The transistor 6 adjacent to the input terminal 2 is known as the control FET or high side transistor, and the transistor 8 adjacent to the ground is known as the synchronous (sync) FET or low side transistor. The high side is relatively more positive than the low side, though it is not necessary that either the high or the low side has any particular relationship to ground.

The node between the transistors 6, 8 is known as the switch node 10. The switch node feeds through an inductor 12 and across a capacitor 14 to an output 16.

The control and sync FETs are driven by respective drivers 30, 32.

A control circuit 18 has one input on an input control terminal 20 and another input fed from the output 16 via a feedback path 22. The control circuit 18 supplies control signals to control the FETs 6, 8 to maintain a constant voltage at the output by switching transistors 6, 8 off and on alternately. The control signals are alternating signals which cause the control and sync FETs to conduct alternately. The mark-space ratio is varied, i.e. the ratio of the time for which the control FET conducts to the time the sync FET conducts is modulated, to achieve the desired voltage on the output 16.

Examples of such dc—dc converters include those presented in WO98/49607 to Intel Corporation and U.S. Pat. No. 5,479,089 to Lee.

One feature of synchronous dc—dc converters is that it is not generally desired to switch on both high and low side transistors 6, 8 simultaneously. If both transistors are on, the input voltage is short-circuited by current passing directly between the two input terminals 2, 4 through the control and sync FETs. The phenomenon known as "shoot-through". Accordingly, the control circuit 18 is generally arranged to ensure that only one of the two transistors 6, 8 is on at a time.

This is conventionally carried out by monitoring two voltages. The voltage at the switch node 10 is monitored to prevent the switching on of the low side transistor 8 until the high side transistor 6 is switched off. The voltage at the gate 24 of the low side transistor 8 is monitored to prevent the high side transistor switching on until the low side transistor 8 is switched off. WO98/49607 describes a circuit of this type, as does U.S. Pat. No. 5,479,089 to Lee.

The dead time when neither FET is conducting depends on the transistor threshold voltage and the capacitance of the sync FET, which vary widely due to manufacturing spread of parameters of the chosen FET, as well as according to the individual choice of FET. This means that a control IC has to use conservative estimates of these parameters to produce a dead time that will avoid shoot through. This is generally a longer dead time than would be possible if the control circuit were optimised for the specific FETs used.

The present trend is to increase switching and clock speeds, which increases the significance of the dead time during which neither high or low side transistor 6, 8 is on. It would be beneficial to reduce this time.

A further disadvantage occurs in the case that a plurality of FETs in parallel are used in place of the single high and low side transistors. The parallel FETs never switch at exactly the same time due to different gate resistances and other parameters caused again by manufacturing variations or variability in the circuit in which the FETs are provided. Thus, it becomes difficult to correctly determine when all of the high side or low side FETs are switched off and accordingly when the other FETs can be switched on. The solution generally adopted is to include a gate resistor in the circuit, but this slows down the switching of the MOSFETs and increases switching losses, especially at high frequencies. Accordingly, it would be beneficial to provide a circuit arrangement that could more easily use parallel FETs.

BRIEF DESCRIPTION OF THE DRAWINGS

Figure 2:
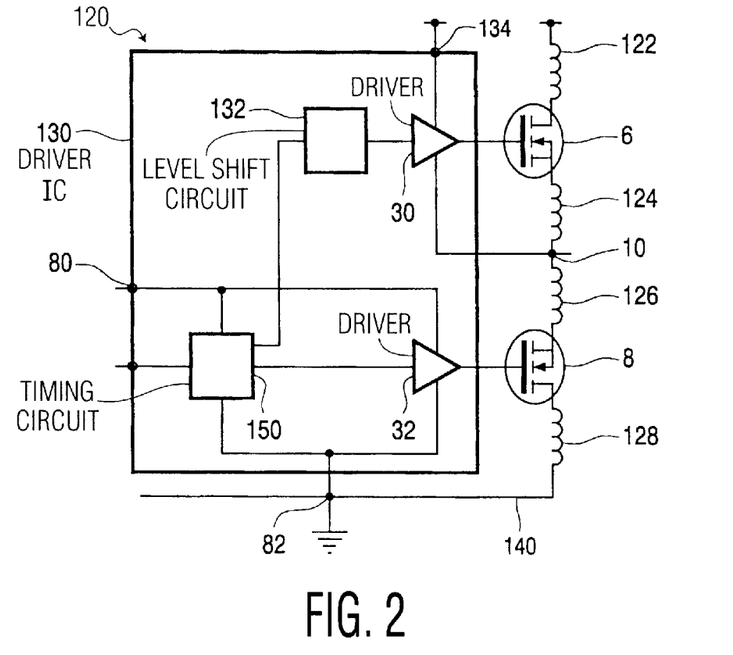
FIG. 2 shows a schematic diagram of a related arrangement.

An implementation of such a synchronous circuit is shown in FIG. 2. A driver IC 120 integrates in a single package 130 a timing circuit 150, a driver 30 for an external control FET 6 and a driver 32 for an external sync FET 8. An external control circuit 18, not shown in FIG. 2, provides a PWM control signal to the timing circuit 150. A voltage is provided between input terminals 80, 82 on the package 130 to provide the electric power to the timing circuit 150. One of the input terminals 82 is a ground terminal connected to ground rail 140, to which the sync FET 8 is also connected. The control FET driver 30 is driven by the voltage between a separate voltage input 134 and the switch node 10 between the control 6 and sync 8 FETs. The control FET driver 30 operates at different dc voltage from the sync FET driver 32, and so is isolated from the sync FET driver 32 and the control circuit 150. Further, a level shift circuit 132 allows signal to pass from the timing circuit 150 to the control FET driver 30 whilst keeping the control FET driver 30 isolated. The control FET driver 30 is thus able to "float" with respect to circuit ground.

A problem with this circuit is that it suffers from switching frequency limitations, due at least in part to the effects of the parasitic inductance in various lead wires which can lead to disturbances in the gate or ground voltage depending on the exact connection arrangement used.

SUMMARY OF THE INVENTION

According to the invention there is provided a low side component comprising a sync FET having a source, a drain and a gate; a driver circuit powered between high and low voltage power connections and with an output connected to the gate of the sync FET for driving the sync FET; a timing circuit for controlling the driver circuit in accordance with a signal on a control input; wherein the driver circuit is isolated from the timing circuit and the low voltage power connection of the driver circuit is directly connected to the source of the sync FET.

Thus, the invention provides a low side FET switch device wherein the FET has an internal direct connection between the source electrode of the FET and the low side of its related gate driver circuit.

This local connection may in particular be a low inductance connection.

Alternative ways of connecting the low side driver suffer from various disadvantages.

One option might be simply to connect the low side driver ground to the circuit ground. This solution is essentially that used in present day circuit arrangements using discrete components (e.g. FIG. 2). However, this approach results in two problems. Firstly, the area enclosed by the circuit loop connecting the driver to the MOSFET gate on one hand and through the ground to the MOSFET source on the other, is relatively large. This results in a high inductance in the gate drive circuit which limits the response time of the gate-source voltage and hence limits the switching speed. Secondly, the high rate of change of current when the FET is switched generates a voltage across the parasitic inductance in the source connection. At turn on of the FET, this reduces the gate-source voltage across the FET chip and slows the switching of the FET. At turn off of the FET, this generates a positive spike on the gate-source voltage which tends to turn the FET back on, this phenomenon being commonly known as "gate bounce".

An alternative option might be to simply connect the driver ground to the source of the FET adjacent to the driver. This addresses the first of the two problems mentioned in the previous paragraph, namely the large area of the circuit including driver and FET. Unfortunately, there is a problem with the alternative option, which is that the voltage across the parasitic inductance at the source connection now generates disturbance in the ground voltage of the timing and driver circuit, commonly known as "ground bounce", which can lead to malfunction of the driver or timing circuits.

In contrast, the inventors have realised that by isolating the driver i.c. from the timing circuit, and connecting the low voltage return of the driver is directly connected to the FET source, advantages can be obtained. The direct, local connection minimises the gate-source loop inductance, contributing to faster rise and fall times of the gate-source voltage. Further, the parasitic inductance in the source connection does not cause a reduction in the gate-source voltage with consequent slower switching at turn-on of the FET.

Moreover, because the driver circuit is isolated from the timing circuit the timing circuit is not susceptible to the ground disturbance that a direct connection of the source of the FET to the grounded low voltage side of the driver would otherwise cause.

A level shift circuit or decoupling circuit may be incorporated between the timing circuit and the driver circuit.

The FET and the driver may be formed in separate semiconductor bodies. The direct connection may be a bond wire connected between the source of the FET and the driver.

In alternative embodiments, the FET and driver are integrated in a common semiconductor body.

The driver circuit may be integrated on the same semiconductor chip as the timing circuit. The driver circuit may be isolated from the rest of the low side component by junction isolation or by using a silicon-on-insulator process.

The low side component may be included in a single package.

The invention is also of application in a complete voltage regulator including both control and sync FETs. Accordingly, the invention may provide a synchronous dc—dc converter circuit comprising a high side driver for driving a control FET; a low side driver for driving a sync FET; a timing circuit for accepting a signal on a control input and controlling the high and low side drivers to drive the control and sync FETs alternately in accordance with the signal on the control input; wherein the high side driver is isolated from the timing circuit and driven by the timing circuit through a level shifter; and the low side driver is isolated from the timing circuit and the high side driver and driven through a level shifter.

The various components of the circuit may be packaged in various ways. For example, a single hybrid circuit package may include the whole circuit, possibly excluding the inductor and capacitor.

Alternatively, the high side driver may be packaged together with the control FET. A separate package may include the low side driver and the sync FET. Each package may include a separate timing circuit.

For a better understanding of the invention, specific embodiments will now be described, purely by way of example, with reference to the accompanying drawings, in which.

The same reference numerals are used for like or corresponding components.

DESCRIPTION OF THE PREFERRED EMBODIMENTS

Figure 3:
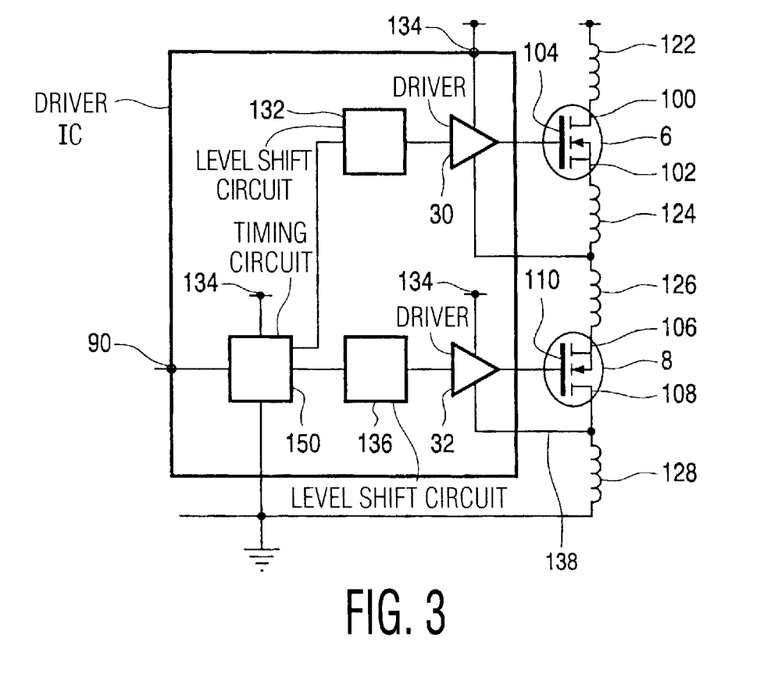
FIG. 3 shows a schematic diagram of a first embodiment of the invention.

Referring to FIG. 3, a circuit according to the invention will now be described; this circuit represents a modification of the synchronous buck converter circuit shown in FIG. 2. As in FIG. 2, a timing circuit 150 controls a control FET driver 30 for driving a control FET 6 and a sync FET driver 32 for driving a sync FET 8. The control FET driver 30 operates at different dc voltage from the sync FET driver 32, and so is isolated on the substrate from the sync FET driver 32 and the timing circuit 150. Further, a level shift circuit 132 allows signal to pass from the timing circuit 18 to the control FET driver 30 whilst keeping the control FET driver 30 isolated. The control FET driver 30 is thus able to "float" with respect to circuit ground.

A level shift circuit 136 isolates the sync FET driver 32. The skilled person will be able to implement the level shift circuits 136 in any suitable way. The sync FET driver 32 is also isolated from the control FET driver 30.

In this embodiment the control FET 6 is a separate semiconductor die with source 102, gate 104 and drain 100 pads. Likewise, the sync FET 8 is a separate semiconductor die with source 108, drains 106 and gate 110. The FETs are both n-channel enhancement MOSFETs. As will be realised, other forms of FET can be used depending on the load required to be driven.

The low voltage side of the sync FET driver 32 is directly connected to the source 108 of the sync FET by direct connection 138.

The direct connection 138 provides a low inductance return path for the current used to drive the gate. In the arrangement shown in FIG. 2, the return path for the gate current is through inductor 128 and common ground rail 140 through input terminal 82. This loop in the prior arrangement of FIG. 2 will inevitably enclose a significant area and hence have a significant inductance, which is greatly reduced in the arrangement of the present invention with a direct connection 138.

Further, the isolation of the sync FET driver 32 ensures that the direct connection 138 does not have the adverse side effect of large swings in the voltage of the body of the semiconductor die, which may in particular affect the timing circuitry 150. These swings are caused by large voltage swings at the source 108 of the sync FET 8 caused by the effects of the switching currents on the parasitic inductors 122, 124, 126, 128, especially the inductance 128 between the source 108 of the sync FET 8 and the ground rail 140 in the arrangement of FIG. 2. In extremis, such voltage swings (ground bounce) could lead to incorrect transitions and errors in control logic in the timing circuit 150. In contrast, the invention isolates any sensitive timing circuitry 150 from the sync FET driver 32 to minimise these effects.

The isolation of the sync FET driver 32 may be achieved in a number of ways. For example, the sync FET 32 and control FET 30 drivers may be integrated in a single semiconductor die with the timing circuit, using isolation technology such as junction isolation or the use of a silicon on insulator process. An example of this approach is described in U.S. Pat. No. 4,929,884 to Bird et al assigned to U.S. Philips Corp., the contents of which are hereby incorporated by reference.

Figure 4:
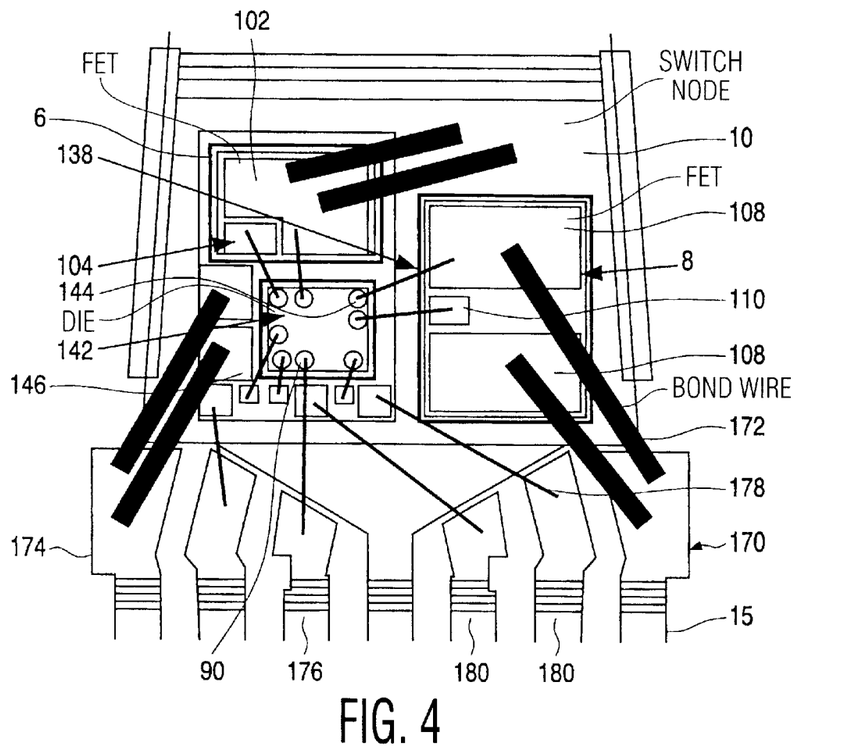
FIG. 4 illustrates the packaging of the first embodiment.

However, in a preferred embodiment of the invention, illustrated in FIG. 4, the control 6 and sync 8 FETs are implemented as separate dies, and the driver and timing circuits are implemented as a single die 142.

The MOSFETs 6, 8 have drain connections on their underside. The control FET 6 is mounted on a drain pad 146, and the sync FET 8 on a switch node pad 10. Thick bond wires 172 connect the control FET 6 to the switch node 10, and further connect the drain pad 146 to a drain pin 174 and the source 108 of the sync FET 8 to the source pin 151. A control pin 176 is connected through bond wires 178 to the control input 90 on the drive die 142. Other pins 180 provide the various power inputs.

The package may be completed in any known way. The pins 174, 176, 180 may constitute a lead frame 170.

The direct connection 138 is between a pad 144 on the driver ic 142 and the source pad 108 on the sync FET 6. The pad 144 is the low voltage return of the sync FET driver circuit 32.

Figure 5A:
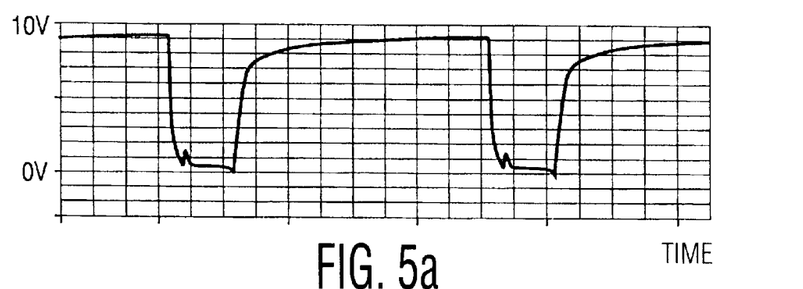
FIGS. 5a and 5b illustrate how the arrangement of the first embodiment reduces gate bounce.
Figure 5B:
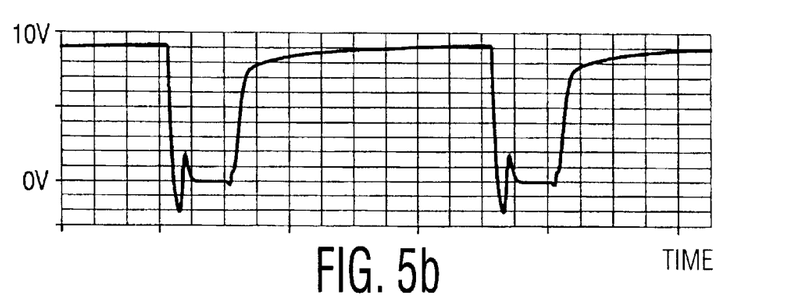

It is particularly preferred that the connection between the ground return of the driver and the source of the transistor is as direct as possible. FIG. 5 illustrates the gate-source voltage across the sync FET 6 to illustrate the ground bounce in two arrangements based on FIG. 4. In the arrangement of FIG. 5*a*, the pad 144 on the driver is directly connected to the source pad 148 by a bond wire 138, as shown in FIG. 4. In the arrangement of FIG. 5*b*, the direct connection is instead between the driver pad 144 and the source pin 150 to which the source pad 148 is connected by means of high current bond wires 152. Even this small change, all within the same package, makes a very significant change to the gate bounce, which is almost twice as significant in the arrangement of FIG. 5*b* as in FIG. 5*a*.

Figure 6:
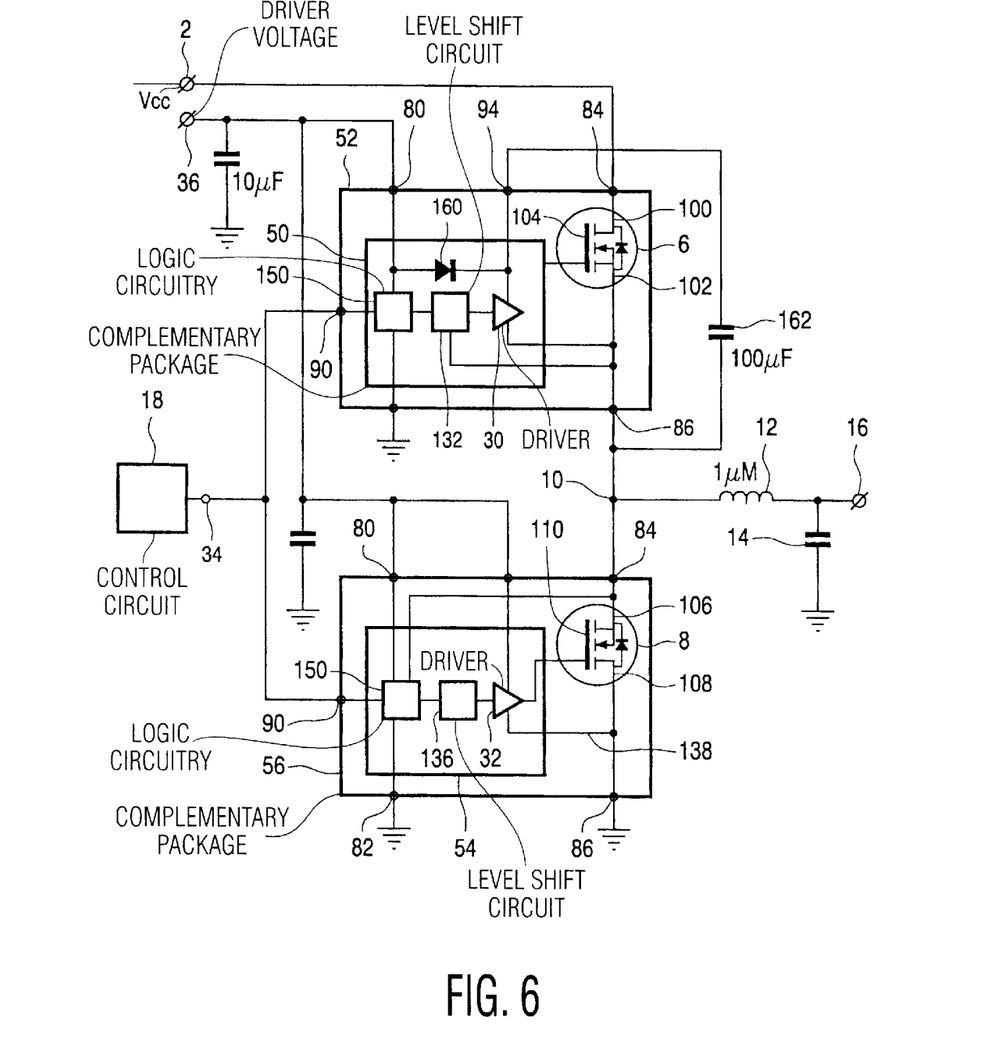
FIG. 6 is a circuit diagram of a second embodiment of the invention.

In a second embodiment of the invention, illustrated schematically in FIG. 6, instead of a single package containing both FETs, as in the first embodiment, a pair of complementary packages 52, 56 each containing a driver circuit and one of the FETs is provided.

As before, the sync FET driver 32 has a low side connection 138 directly to the source 108 of the sync FET 8. This delivers the same advantages as in the arrangement of FIG. 1.

The control FET 6 is packaged together with the corresponding high side driver circuitry 32 in a package 52. The sync FET 8 is packaged with corresponding low side driver circuitry 30 in another package 56.

In a preferred embodiment, both of the packages 52, 56 contain logic circuitry 150 which only switches on the corresponding FET when the switch node 10 voltage falls below a predetermined value. This means that there is no need for communication between the packages 52, 56, except that both are commonly driven by the same control pulse on input 34.

Thus separate packages 52, 56 are provided that in combination prevent shoot through. The integration of the drivers with the corresponding FETs within the same package and without needing additional signals from other circuit elements to prevent shoot-through means that the arrangement of FIG. 6 is capable of high speed switching.

A driver voltage for driving the drivers 30, 32 is provided to input 80 on both packages 52 and 54 from terminal 36. The packages also have ground inputs 82, signal inputs 90, drain inputs 84 and source inputs 86. Thus, the drain input 84 for providing the high side drain voltage to the FET is separate from the input driving the drivers 50,54.

A boost capacitor 162 is connected between a boost output 94 and the switch node 10. The boost capacitor 162 enables higher voltages to be output than would otherwise be the case.

Figure 7:
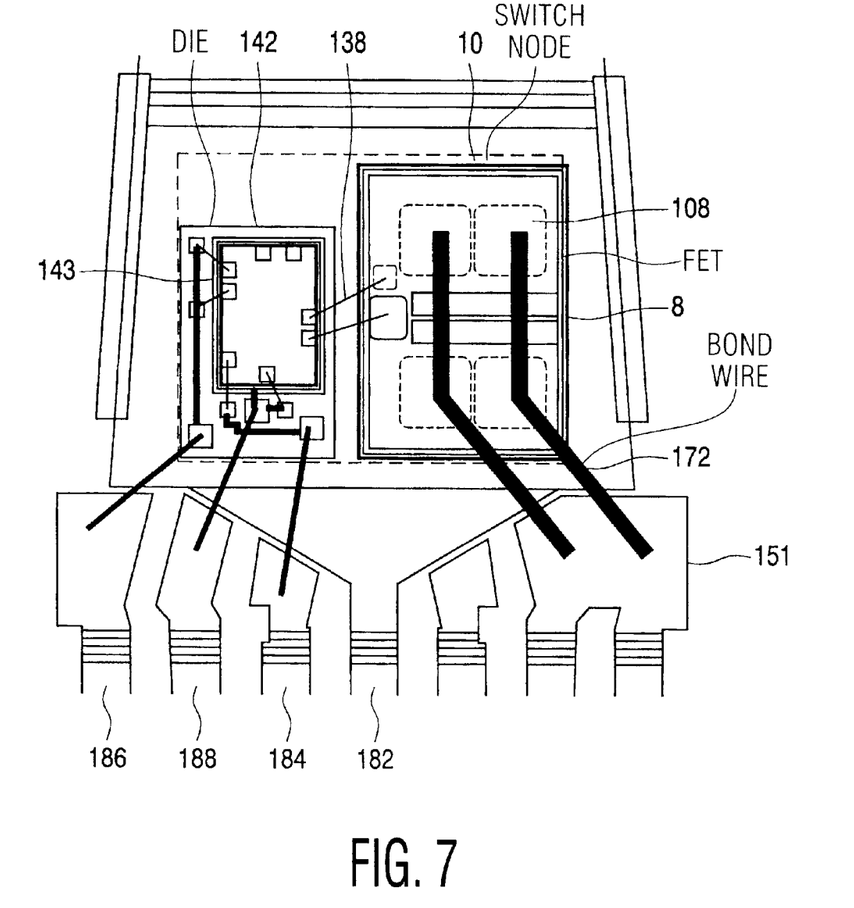
FIG. 7 illustrates one of the packages used in the second embodiment.

The low side device 56 may be packaged as illustrated in FIG. 7. The high side package is similar. Like components are given like reference numerals to those in FIG. 4. One difference is that the switch node output is through the pin 182 connected to the package pad on which the sync FET is mounted. Control 184, high voltage 186 and low voltage 188 pins are likewise provided. Direct bond wire 138 connects the low voltage return of the driver circuit 32 on the driver/logic circuit die 143 directly to the source 108 of the sync FET 8.

Figure 8:
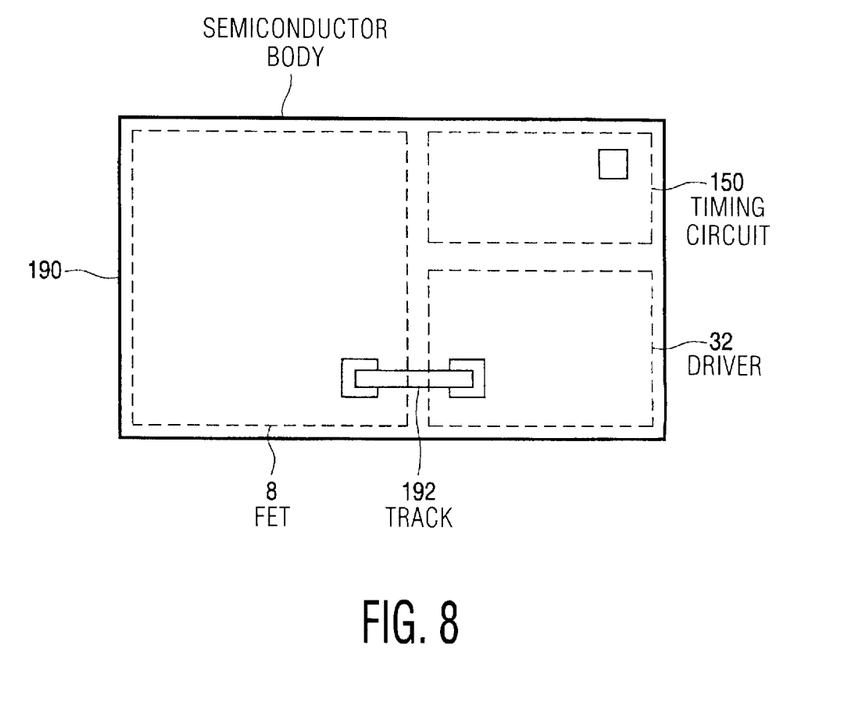
FIG. 8 shows a third embodiment of the invention.

FIG. 8 illustrates an alternative arrangement in which the sync FET 8, driver 32 and timing circuit 150 are implemented as separate regions on a common semiconductor body 190. A metallisation track 192 forms the direct connection. The metallisation track 192 may be made of any suitable material: metal, for example aluminium, poly silicon, amorphous silicon, silicide, or polycide.

The invention is not limited to the embodiments described and the skilled person will readily conceive of other possibilities.

The ways in which the components are divided between packages can be varied as required. The whole synchronous dc—dc converter may be a single hybrid circuit. Alternatively, the two FETs can each be in separate packages integrated with their respective timing and driver circuits. Any suitable form of level shift circuit may be used. In some approaches, a simple decoupling capacitor may be sufficient. Alternatively, electronic circuits for carrying out this function that may be implemented on a semiconductor die are known and may be used.

The invention is not merely suitable for use with synchronous dc—dc converter circuits, but is of more general application. For example, it may be used together with class D amplifiers for audio applications which tend to switch at a few hundred kiloHertz.

What is claimed is:

1. A low side component comprising
   a sync FET having a source, a drain and a gate;
   a driver circuit powered between high and low voltage power connections and with an output connected to the gate of the sync FET for driving the sync FET;
   a timing circuit for controlling the driver circuit in accordance with a signal on a control input;
   wherein the driver circuit is isolated from the timing circuit and the low voltage power connection of the driver circuit is directly connected to the source of the sync FET.

2. A low side component according to claim 1 further comprising a level shift circuit between the timing circuit and the driver circuit.

3. A low side component according to claim 1 further comprising a pair of voltage input terminals to supply power to the timing circuit, and source and drain terminals connected to the source and drain of the sync FET.

4. A low side component according to claim 1 wherein the timing circuit controls the driver circuit based on the voltage at the drain of the sync FET, the timing circuit only causing the driver circuit to turn on in response to a signal on the control input after the timing circuit detects a negative edge at the drain of the sync FET.

5. A low side component according to claim 1 in which the sync FET and the driver are formed in separate semiconductor device bodies, and a direct bond wire between the source of the sync FET and the driver forms the direct connection.

6. A low side component according to claim 1 in which the sync FET and driver are integrated on a common semiconductor body and a metallisation track forms the direct connection.

7. A synchronous dc—dc converter circuit comprising
   a high side driver for driving a control FET;
   a low side driver for driving a sync FET;
   at least one timing circuit for accepting a signal on a control input and controlling the high and low side drivers to drive the control and sync FETs alternately in accordance with the signal on the control input;
   wherein the high side driver is isolated from the timing circuit and driven by the timing circuit through a level shifter; and
   the low side driver is isolated from the timing circuit and the high side driver and driven through a level shifter.

8. A synchronous dc—dc converter circuit according to claim 7 further comprising
   a control FET having a source, a drain, and a gate, the gate being connected to the high side driver; and
   a sync FET having a source, a drain and a gate, the gate being connected to the low side driver;
   the source of the control FET and the drain of the sync FET being connected together at a switch node for output;
   wherein the low voltage return of the low side driver is connected to the source of the sync FET.

9. A synchronous dc—dc converter circuit according to claim 8 further comprising an inductor connected between the switch node and an output and a capacitor connected between the output and ground.

10. A synchronous dc—dc converter according to claim 8 wherein the timing circuit controls the driver circuits based on the voltage at the switch node, the timing circuit only causing one of the driver circuits to turn on in response to a signal on the control input after the timing circuit detects a negative edge at the switch node.

* * * * *